(12) United States Patent
Lee et al.

(10) Patent No.: US 6,174,754 B1
(45) Date of Patent: Jan. 16, 2001

(54) METHODS FOR FORMATION OF SILICON-ON-INSULATOR (SOI) AND SOURCE/DRAIN-ON-INSULATOR(SDOI) TRANSISTORS

(75) Inventors: Jin-Yuan Lee; Mong-Song Liang; Boon-Khim Liew, all of Hsin-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/527,608

(22) Filed: Mar. 17, 2000

(51) Int. Cl.[7] .................................................. H01L 21/335
(52) U.S. Cl. ........................ 438/142; 438/149; 438/206; 437/21; 437/24; 437/32; 437/62; 437/99; 156/643; 156/644; 117/8
(58) Field of Search ................................... 438/142, 149, 438/204; 437/99, 24, 32, 21, 62; 156/643, 644; 117/8

(56) References Cited

U.S. PATENT DOCUMENTS

| 4,506,435 | 3/1985 | Pliskin et al. ............... 29/576 W |
|---|---|---|
| 4,749,441 | 6/1988 | Christenson et al. ............ 156/644 |
| 4,966,861 | 10/1990 | Mieno et al. ................... 437/99 |
| 5,407,529 | 4/1995 | Homma ........................ 156/643 |
| 5,445,107 | 8/1995 | Roth et al. ...................... 117/8 |
| 5,610,087 | 3/1997 | Hsu et al. ...................... 437/32 |
| 5,612,230 | 3/1997 | Yuzurihara et al. ............. 437/21 |
| 5,670,389 | * 9/1997 | Huang et al. .................. 437/21 |
| 5,686,343 | 11/1997 | Lee ............................. 437/62 |
| 5,712,173 | 1/1998 | Liu et al. ....................... 437/24 |
| 5,728,613 | 3/1998 | Hsu et al. ..................... 438/204 |
| 5,869,359 | 2/1999 | Prabhakar ..................... 438/149 |
| 5,882,958 | 3/1999 | Wanlass ....................... 438/149 |
| 5,891,763 | 4/1999 | Wanlass ....................... 438/149 |

* cited by examiner

Primary Examiner—Vu A. Le
Assistant Examiner—Pho Luu
(74) Attorney, Agent, or Firm—George O. Saile; Stephen & Ackerman; Stephan G. Stanton (57) ABSTRACT

A method for fabricating a transistor device on a semiconductor substrate, comprising the following steps. A semiconductor substrate having a silicon surface with an overlying insulating dielectric layer is provided. The insulating dielectric layer is patterned to define hole/channel regions having predetermined widths. An amorphous silicon layer is formed having a predetermined thickness over the dielectric layer and the hole/channel regions, filling the hole/channel regions. Heating (grain growth) the amorphous silicon layer to form a planar silicon layer, comprising at least a portion of epitaxial-silicon, having a predetermined thickness, over the dielectric layer and through the hole/channel regions, filling the hole/channel regions. The planar silicon layer is patterned to expose the hole/channel regions and define transistor regions. Trenches are formed in the silicon surface adjacent the transistor regions. Shallow trench isolation regions are formed filling the trenches and having a predetermined depth. Transistor structures are formed within the transistor regions, separated by the shallow trench isolation regions.

31 Claims, 5 Drawing Sheets

METHODS FOR FORMATION OF SILICON-ON-INSULATOR (SOI) AND SOURCE/DRAIN-ON-INSULATOR(SDOI) TRANSISTORS

FIELD OF THE INVENTION

The present invention relates generally to methods for forming transistors employed in integrated circuit (IC) fabrication. More particularly, the present invention relates to methods for forming silicon-on-insulator (SOI) and source/drain on insulator (SDOI) transistors.

BACKGROUND OF THE INVENTION

Integrated circuits are formed from semiconductor substrates, usually silicon (Si), within and upon whose surfaces are formed active semiconductor regions containing electrical circuit elements that are internally and externally connected to the substrate through multiple patterned conductor layers that are separated by dielectric layers. These active semiconductor regions must be otherwise electrically isolated from adjacent active semiconductor regions by the formation of intervening trenches which are subsequently filed with dielectric material to ensure such electrical isolation and avoid undesired interference between adjacent active semiconductor regions. The continued miniaturization of integrated circuit devices has resulted in smaller trenches formed by, for example, shallow trench isolation (STI) methods to form trench isolation regions essentially co-planar with adjacent active semiconductor regions of the semiconductor substrates.

One approach to reducing undesired stray capacitance has been to use silicon-on-insulator (SOI) substrates. This allows higher operating frequencies, better packing density, borderless contacts, latch-up freedom, and radiation hardness. However, junction leakage and capacitance are still too high for newer applications and the wafer cost to form typical SOI transistors is very high.

U.S. Pat. No. 5,712,173 to Liu et al. describes a method of forming a semiconductor device having the advantages of a silicon on insulator structure by implanting oxygen ions using the gate electrode as a mask and then heating to form thin, self-aligned buried oxide regions extending from a field oxide region under source/drain regions and self-aligned with the side surfaces of the gate electrode. In an alternate embodiment, the buried oxide layer extends from a point proximate the field oxide region and/or partially under the gate electrode.

U.S. Pat. No. 4,506,435 to Pliskin et al. describes first lining the trench with a silicon oxide lining then filling the trench with, for example, a borosilicate glass. The borosilicate glass layer is heated, causing it to soften and flow to approach planarity. Then the borosilicate glass layer and SiN mask layer are etched to make the borosilicate glass filled trench substantially planar with the SiO masking layer.

U.S. Pat. No. 5,882,958 to Wanlass describes a method of producing silicon-on-insulator (SOI) metal-oxide semiconductors (MOS) by damascene patterning of source-drain regions in a thin film of amorphous silicon deposited on a layer of oxide grown on a silicon wafer, where the oxide has previously been etched with a pattern of trenches. The method provides for the amorphous layer to contact the underlying silicon substrate through multiple small oxide openings, where subsequent transistor channel regions will align to these openings.

U.S. Pat. No. 5,891,763 to Wanlass describes a process for producing planar silicon-on-insulator MOS transistors having a polysilicon gate. The channel regions are created in an underlying single crystal silicon wafer, and the source-drain extensions regions are created by damascene patterning a thin film of amorphous silicon deposited on a layer of oxide deposited on the silicon wafer.

U.S. Pat. No. 5,869,359 to Pabhakar describes a method of producing silicon-on-insulator devices having elevated source and drains and a polysilicon gate. The silicon-on-insulator oxide is only under the source/drain regions and not under the channel. Greater control over the channel length is achieved.

U.S. Pat. Nos. 5,610,087 and 5,728,613, both to Hsu et al., each describe methods in which narrow base width, lateral bipolar junction transistors (BJT), and short channel length metal-oxide semiconductor field-effect transistor (MOSFET) devices can be simultaneously fabricated in a silicon-on-insulator (SOI) layer.

U.S. Pat. No. 5,445,107 to Roth et al. describes a method of forming a semiconductor device from a silicon-on-insulator film formed by solid phase epitaxial re-growth. A layer of amorphous silicon is formed such that it is only in direct contact with an underlying portion of a silicon substrate. The layer of amorphous silicon is subsequently annealed to form a monocrystalline layer of epitaxial-silicon having a low density of crystal defects since the layer of amorphous silicon is only in contact with an underlying portion of a silicon substrate allowing uniform epitaxial re-growth.

U.S. Pat. No. 5,612,230 to Yuzurihara et al. describes a process for forming a semiconductor device by applying a non-single-crystalline material on a sidewall inside of an opening portion for growing a single-crystalline semiconductor body.

U.S. Pat. No. 4,749,441 to Christenson et al. describes a method of fabricating single crystal silicon in a "mushroom" shape to use in fabricating devices such as a silicon-on-insulator-like MOSFET.

U.S. Pat. No. 5,686,343 to Lee describes a method for the isolation of a semiconductor layer on an insulator. A window is formed within a first insulating layer which becomes an epitaxial growth seed; a semiconductor layer is deposited and an epitaxial layer having the same crystal structure as the semiconductor substrate under the window is grown; an active area of the epitaxial layer is formed by a photolithographic process; a second insulation layer on and at the side of the active area and on the first insulating layer is formed; and an active area is isolated from the semiconductor layer by forming a third insulator layer in the window by an oxidation process.

SUMMARY OF THE INVENTION

Accordingly, it is an object of the present invention to fabricate an improved silicon-on-insulator (SOI) transistor by fully isolating the active regions from the substrate by the use of a dielectric layer and isolating adjacent active regions with shallow trench isolation (STI) methods.

Another object of the present invention to fabricate a silicon-on-insulator (SOI) transistor having lower junction leakage and lower junction capacitance.

A further object of the present invention is to fabricate a silicon-on-insulator (SOI) transistor by growing epitaxial-silicon into the active regions.

Yet another object of the present invention is to fabricate a silicon-on-insulator (SOI) transistor having an improved transistor short channel effect by allowing shallow source/drain junctions.

Another object of the present invention is to fabricate a silicon-on-insulator (SOI) transistor without a floating channel by growing epitaxial-silicon from the channel region.

Another object of the present invention to fabricate a source/drain-on-insulator (SDOI) transistor by isolating the source/drain regions from the substrate by the use of a dielectric layer.

Another object of the present invention to fabricate a source/drain-on-insulator (SDOI) transistor having lower manufacturing costs than a silicon-on-insulator (SOI) transistor.

A further object of this invention is to fabricate a source/drain-on-insulator (SDOI) transistor by growing epitaxial-silicon in the channel and lightly doped drain (LDD) regions, while growing epitaxial-silicon and polysilicon in the source/drain regions.

Yet another object of the present invention is to fabricate a fully SOI transistor by growing epitaxial-silicon through an oxide opening in field region into active region.

Other objects will appear hereinafter.

It has now been discovered that the above and other objects of the present invention may be accomplished in the following manner. Specifically, in one embodiment, a semiconductor substrate having a silicon surface with an overlying insulating dielectric layer is provided. The insulating dielectric layer is patterned to define hole regions having predetermined widths. An amorphous silicon layer having a predetermined thickness is formed over the dielectric layer and hole regions, filling the hole regions. The amorphous silicon layer is heated to form a planar epitaxial-silicon layer having a predetermined thickness over the dielectric layer through the hole regions with substrate silicon serving as a seed layer, filling the hole regions. The epitaxial-silicon layer is patterned to expose the hole regions and define transistor regions separated by the hole regions. Shallow trench isolation regions having predetermined depths are formed including the hole regions. Transistor structures are formed within the transistor regions, separated by the shallow trench isolation regions. The transistor structures include a gate on the transistor region and source and drain regions on either side of the gate also formed on the transistor region such that the transistor structures are on the patterned epitaxial-silicon-on-insulating dielectric layer. In another embodiment, a semiconductor substrate having a silicon surface with an overlying insulating dielectric layer is provided. The insulating dielectric layer is patterned to define a channel region, or opening in the field region, with the dielectric layer being divided into left inner and outer portions and right inner and outer portions. A silicon layer is formed, having a predetermined thickness, over the dielectric layer and the channel region, or opening in the field region. The silicon layer is then heated to form planar polysilicon layers, having predetermined widths and thicknesses, over the left and right outer insulating dielectric layer portions and to form a planar epitaxial-silicon layer, having a predetermined width and thickness, over the left and right inner insulating dielectric layer portions and within the channel region, or opening in the field region, filling the channel region. The polysilicon and epitaxial-silicon layers are patterned to define a transistor region. A transistor structure is then formed within the transistor region. The transistor structure having: a gate centered on the channel region (epitaxial-silicon) and source and drain regions on either side of the gate formed within the planar polysilicon layer and part of the planar epitaxial layer outward of the channel region whereby the source and drain regions are on said patterned insulating dielectric layer.

BRIEF DESCRIPTION OF THE DRAWINGS

For a more complete understanding of the invention, reference is hereby made to the drawings, in which.

DETAILED DESCRIPTION OF THE PREFERRED EMBODIMENT

Unless otherwise specified, all structures, layers, processes etc. may be formed or accomplished by conventional methods known in the prior art.

Preferred Embodiment

Figure 1:
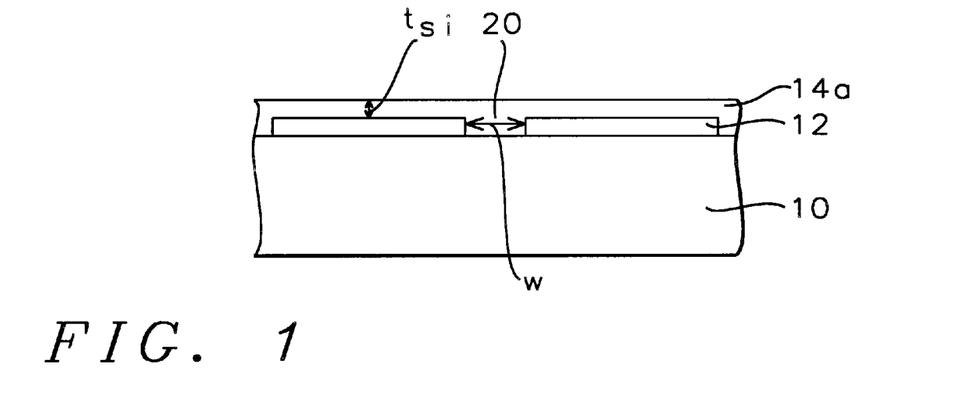
FIGS. 1 to 5 show a series of schematic cross-sectional diagrams illustrating the results of progressive stages in fabricating a silicon-on-insulator (SOI) transistor in accordance with a preferred embodiment of the method of the present invention.
Figure 2:
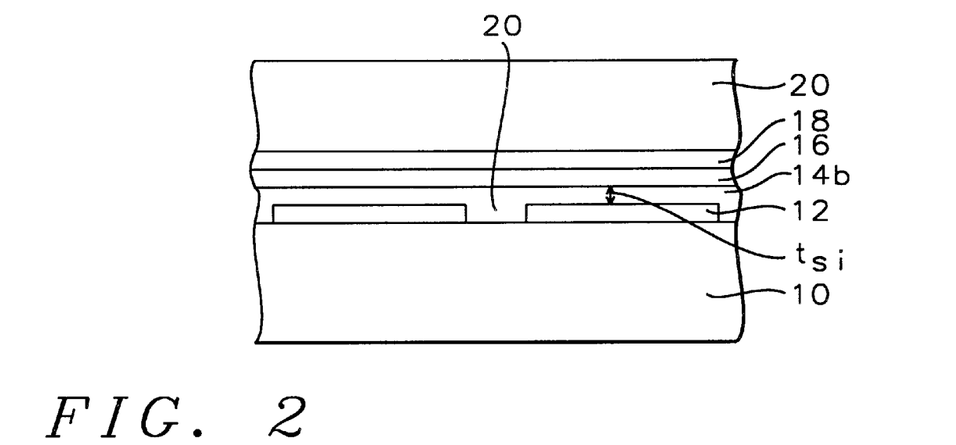
Figure 3:
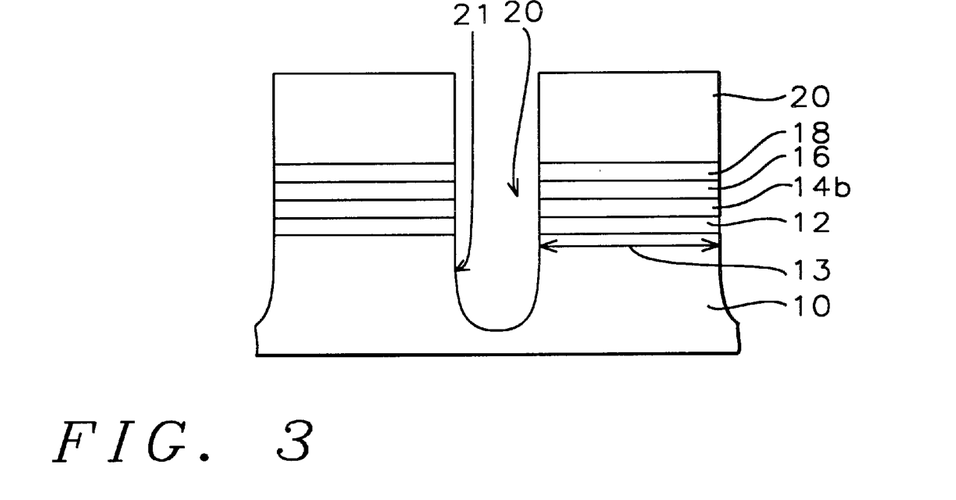
Figure 4:
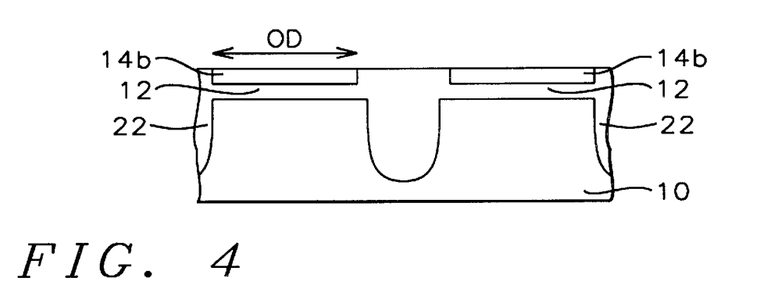

Briefly, the preferred embodiment of the present invention comprises the steps shown below:

FIG. 1: formation of a insulation dielectric layer over a semiconductor silicon substrate by oxidation or chemical-vapor deposition (CVD);

Open holes for silicon epitaxial growth by photolithography and etching;

Formation of epitaxial-silicon by amorphous silicon deposition and grain growth at about from 550° C. to 650° C.;

FIGS. 2 and 3: definition of the active region of the transistor structure by:

formation of a pad oxide layer on the epitaxial-silicon layer;

formation of an $Si_3N_4$ layer over the pad oxide layer;

patterning the $Si_3N_4$ layer, pad oxide layer, epitaxial-silicon layer, insulation dielectric layer, by photolithography and etching, and etching of the semiconductor silicon substrate to define the outside diameter of the transistor structure and the holes for grain growth;

FIG. 4: shallow trench isolation (STI) processing in the formed holes;

Removing the $Si_3N_4$ layer and pad oxide layer; and

Figure 5:
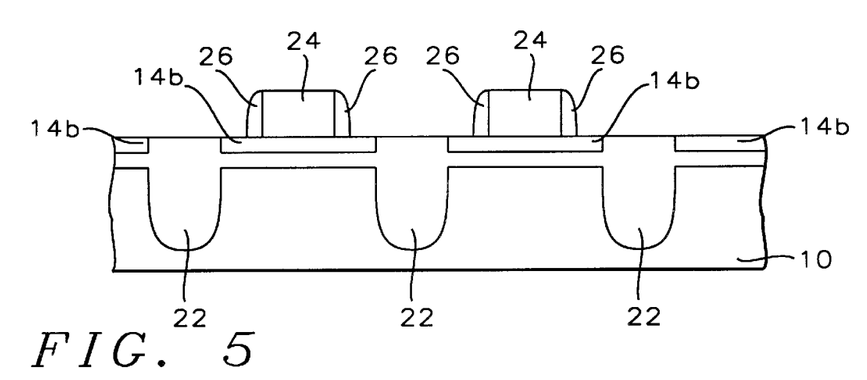

Formation of silicon-on-insulator (SOI) transistors over the defined active regions.

Accordingly as shown in FIG. 1, a semiconductor structure 10 is covered by an insulation dielectric layer 12 from about 30 to 3000 Å thick and more preferably 50 to 500 Å thick. Dielectric layer 12 is deposited as a continuous film over the wafer. Semiconductor structure 10 is understood to possibly include a semiconductor wafer or substrate, and active and passive devices formed within the wafer. Semiconductor structure 10 includes an uppermost silicon (Si) substrate surface. Dielectric layer 12 is formed by oxidation or by chemical-vapor deposition (CVD), with oxidation the preferred method.

Dielectric layer 12 is patterned to define hole regions 20 having a width "w" from about 500 to 10,000 Å and more preferably 1000 to 2000 Å wide.

In a key two step process, epitaxial-silicon (epi-Si) is formed over dielectric layer 12. In the first step, amorphous silicon is deposited over patterned dielectric layer 12 and within hole regions 20, filling hole regions 20 to form amorphous silicon layer 14a. The amorphous silicon is deposited by a chemical vapor deposition (CVD) process by thermal decomposition with $SiH_2Cl_2$ or $SiH_4$ at a temperature between about 500° C. to 600° C. and has a thickness of between about 300 to 1500 Å with a preferred thickness of 700 Å.

In the second step, amorphous silicon layer 14a is then heated (annealed) (silicon grain growth) at from about 550° C. to 650° C. in inert gas or a vacuum to form planar epitaxial-silicon layer 14b having a thickness $t_{si}$ from about 300 to 1500 Angstroms (Å) and more preferably 500 to 1000 Å above patterned dielectric layer 12. Epitaxial-silicon layer 14b has the same crystalline structure (100) as the underlying silicon substrate layer (100) on semiconductor structure 10. Epi-Si layer 14b is preferably single crystalline. In this method, the thickness of epitaxial-silicon 14b on dielectric layer 12 is almost the same as deposited so the thickness is very easily controlled. The contact between epitaxial-silicon layer 14b with the underlying silicon substrate layer will allow fabrication of transistors without floating channels if the contacts are located at the channel region.

The outside diameter OD of the active, or transistor, area is then defined. For example, as shown in FIG. 2, a pad oxide layer 16 is then deposited over epitaxial-silicon layer 14b. Pad oxide layer 16 is formed by a conventional oxidation or CVD process and has a thickness of between about 50 Å to about 300 Å with a preferred thickness of 100 Å. An etch mask layer of silicon nitride ($Si_3N_4$) 18 is then formed over pad oxide layer 16 by a conventional CVD method and has a thickness of between about 500 Å to about 2000 Å with a preferred thickness of 1000 Å.

Pad oxide layer 16 serves to bind silicon nitride, $Si_3N_4$ for example, layer 18 to epitaxial-silicon layer 14b and to reduce stress between $Si_3N_4$ layer 18 and underlying epitaxial-silicon layer 14b. Pad oxide layer 16 also serves as a stop layer for the oxide CMP in the STI process.

$Si_3N_4$ layer 18, pad oxide layer 16, and epitaxial-silicon layer 14b are patterned by, for example as shown in FIG. 3, depositing, exposing and developing photoresist layer 20 by photolithography as is well known in the art, followed by etching by a dry or wet etch. The etching also etches uppermost silicon surface of substrate 10 to form trenches 21 having a depth from about 1000 to 4000 Å, and more preferably from about 2000 to 3000 Å. The remaining layer of epitaxial-silicon layer 14b defines the outer diameter of the subsequently formed transistors, or active areas.

Referring to FIG. 4, photoresist layer 20 is removed by any conventional method, for example by $O_2$ plasma. Shallow trench isolation regions (STI) 22 are then filled with oxide followed by a CMP process to expose $Si_3N_4$ layer 18. Then $Si_3N_4$ layer 18 is removed by $H_3PO_4$ plus $H_2O_2$ solution and pad oxide layer 16 is removed by a diluted HF solution.

As shown in FIG. 5, transistor devices, or other devices, are then formed on the active regions defined by patterned epitaxial-silicon layer 14b. For example, a thin silicon dioxide layer may be thermally grown at a temperature between about 700° to 1000° C., to a thickness between about 15 to 80 Å. This silicon dioxide layer will be used as the gate oxide insulator layer for the subsequent transistor device. A polysilicon film is next deposited using low pressure chemical vapor deposition (LPCVD) processing at a temperature between about 550 to 650° C. to a thickness between about 1200 to 3000 Å. The polysilicon layer can be deposited intrinsically and doped during the following source/drain implant process. The polysilicon film can also be deposited by using insitu doping procedures which include the addition of either phosphine or arsine to the silane ambient. Standard photolithographic and reactive ion etching (RIE) procedures, using $Cl_2$ or HBr as an enchant, are employed to create a polysilicon structure.

The SOI transistors formed in accordance with present invention permit: ease of control of the thickness of the active silicon; lower crystal defect in the active silicon; and the process is very similar to conventional IC process so the manufacturing cost is lower than prior art SOI transistor formation.

Insulator side wall spacers 26 are created for gate by initially depositing silicon oxide, using either LPCVD or plasma enhanced chemical vapor deposition (PECVD), processing at a temperature between about 600° to 800° C., to a thickness between about 800 to 2500 Å. Next, an anisotropic, RIE procedure, using $CHF_3$ as an etchant, is employed to create the spacers.

An ion implantation step, using arsenic at an energy between about 5 to 40 Kev., at a dose between about 1E14 to 1E16 atoms/cm$^2$, is used to create source and drain areas having a shallow source/drain junction, thus providing an improved transistor short channel effect. This creates a silicon-on-insulator transistor that provides the advantages of having a smaller source/drain coupling capacitance, lower source/drain leakage to substrate, and a lower sub-threshold leakage since there is no source/drain junction. The only junction is source/drain along the gate edge.

Although one example of a SOI transistor has been fabricated for illustrative purposes, the novel method of the present invention may be use to fabricate many other SOI integrated circuit structures/transistors.

Field effect transistors (FET) and other devices are completed by conventional steps.

Figure 6:
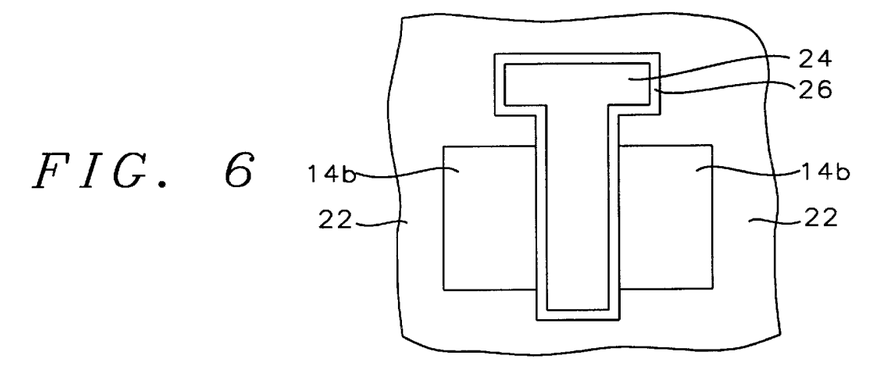
FIG. 6 is a top down view of a device fabricated in accordance with a preferred embodiment of the method of the present invention.

FIG. 6 is a top down view of the device fabricated in accordance with the present invention showing device 24 having spacer 26, active region 14b, and shallow trench isolation regions 22.

The advantages of the present invention is the active regions are performed after epitaxial-silicon growth (epigrowth) through photolithography and etching process so the oxide opening for epi-growth can be outside the active region to form a true SOI transistor. The oxide opening for epi-growth in the channel region is only one of the options in the present invention. In the U.S. Pat. No. 5,882,958 Wanlass patent, for example, the active regions are performed through oxide trench and amorphous silicon CMP so the oxide opening for epi-growth can only be within active region. Also, in the Wanlass patent, it is difficult to control the thickness of active silicon in a whole wafer with different size of active region and it is not fully SOI since the channel region does not isolate to substrate.

Alternate Embodiment

Figure 7:
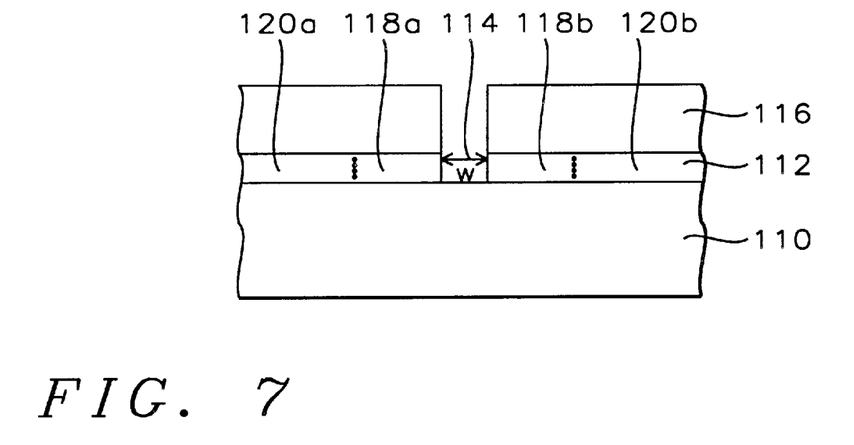
FIG. 7 to 11 show a series of schematic cross-sectional diagrams illustrating the results of progressive stages in fabricating a source/drain-on-insulator (SDOI) transistor in accordance with an alternate embodiment of the method of the present invention.
Figure 8A:
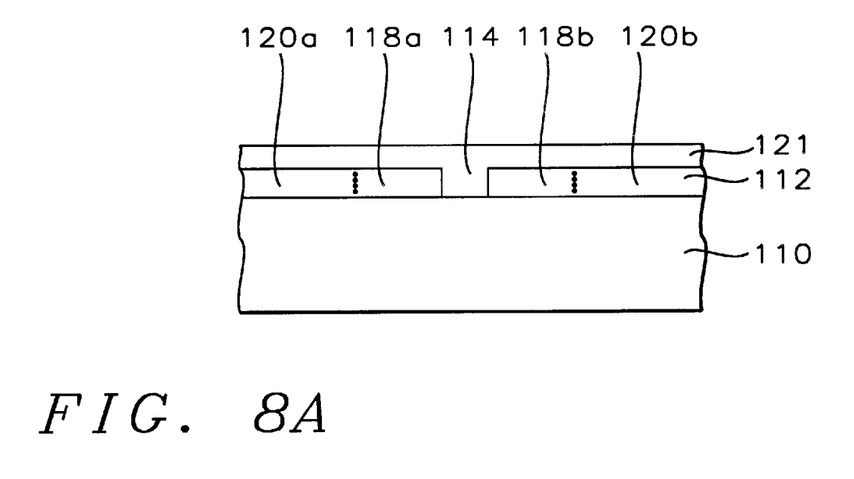
Figure 8B:
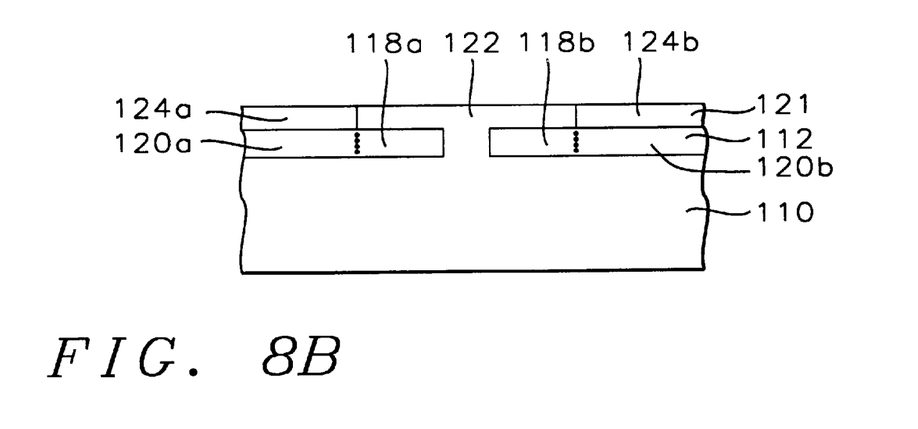
Figure 9:
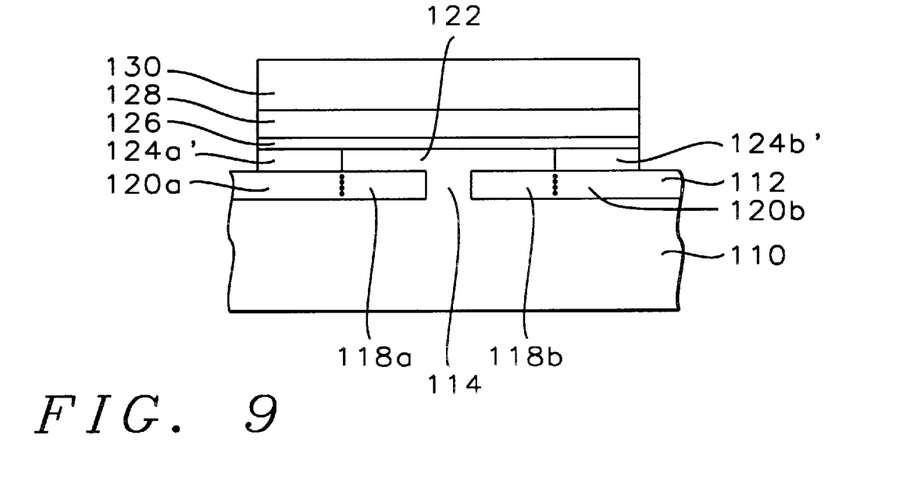
Figure 10A:
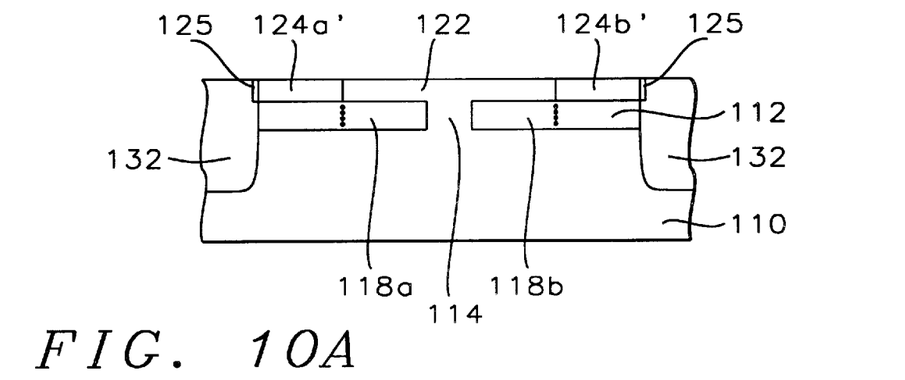
Figure 11:
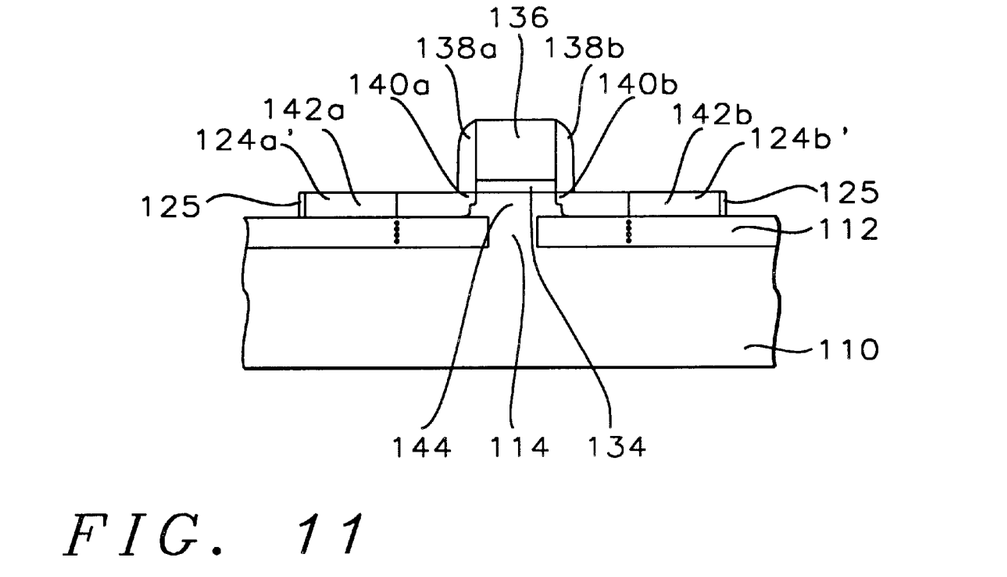

Briefly, the alternate embodiment of the present invention comprises the steps shown below:

FIG. 7: formation of a insulation dielectric layer over a silicon layer by oxidation or chemical-vapor deposition (CVD);

Definition of a channel region, or opening in the field region nearby channel, by photolithography and etching;

FIG. 8A: deposition of amorphous silicon and FIG. 8B: epitaxial grain growth from the opening in channel region, or in field region, to active region, at about from 550° C. to 650° C.;

FIG. 9: definition of the outside diameter of the transistor structure by:
formation of a pad oxide layer over a portion of the epitaxial-silicon and polysilicon layers;
formation of an $Si_3N_4$ layer over the pad oxide layer;
patterning the epitaxial-silicon and polysilicon layers by photolithography and etching to define the outside diameter of the transistor structure;
removing any damaged oxide layer;
removing the $Si_3N_4$ layer and pad oxide layer;

FIG. 10A: optionally, formation of shallow isolation trenches on either side of the defined transistor structure; and FIG. 11: formation of a transistor by:
forming a well;
threshold adjust implant;
formation of a gate oxide;
deposition and patterning of polysilicon to form a gate structure;
forming lightly doped source and drain adjacent the gate structure by ion implantation;
forming side wall spacers adjacent the gate structure; and
forming source and drain regions adjacent the lightly doped source and drain and over the insulation dielectric layer by ion implantation.

As shown in FIG. 11, a semiconductor structure 110 is covered by an insulation dielectric layer 112 from about 30 to 3000 Å thick and more preferably 50 to 500 Å thick. Semiconductor structure 110 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Semiconductor structure 10 includes an upper most silicon (Si) substrate layer. Dielectric layer 112 is formed by oxidation or by chemical-vapor deposition (CVD), with oxidation the preferred method.

Dielectric layer 112 is patterned to define channel region 114 having a width "w" from about 500 to 10,000 Å and more preferably 1000 to 2000 Å wide. For example, dielectric layer 112 may be patterned by depositing, exposing and developing photoresist layer 116 by photolithography over dielectric layer 112, as is well known in the art, followed by etching by a dry or wet etch, for example, as shown in FIG. 7, or may be patterned by direct writing, or other methods. The patterning of dielectric layer 112 to define channel region 114 divides dielectric layer 112 and forms left inner 118a and outer 120a portions and right inner 118b and outer 120b portions, respectively.

As shown in FIG. 8A, amorphous silicon is then deposited over patterned dielectric layer 112 and within channel region 114, filling channel region 114. The amorphous silicon is deposited by the chemical vapor deposition (CVD) process by thermal decomposition with $SiH_2Cl_2$ or $SiH_4$ at a temperature between about 500° C. to 600° C. and has a thickness of between about 300 to 1500 Å with a preferred thickness of 700 Å.

The amorphous silicon layer is then heated (annealed) (silicon grain growth) at from about 550° C. to 650° C. in inert gas or a vacuum to form the contiguous and continuous planar epitaxial-silicon layer 122 and polysilicon layer portions 124a, 24b to form the structure shown in FIG. 8B. The planarized epitaxial-silicon 122 and polysilicon layer portions 124a, 124b are from about 300 to 1500 Å thick and more preferably 500 to 1000 Å thick above dielectric layer 112. Epitaxial-silicon layer 122 fills channel region 114 and has the same crystalline structure (100) as the underlying silicon substrate layer (100) on semiconductor structure 110. Epitaxial-silicon layer 122 should have a width that is greater than the width of the transistor and twice the spacer width. Polysilicon layer portions 124a, 124b have a crystalline structure that is less well defined than the crystalline structure of epitaxial-silicon layer 122, with amorphous silicon having the least well defined crystalline structure. In this method, the thickness of epitaxial-silicon layer portion 122 and polysilicon layer portions 124a, 124b on dielectric layer 112 are almost the same as deposited so the thickness is very easily controlled.

The outside diameter (OD) of the active area, or transistor, is then defined. For example, as shown in FIG. 9, a pad oxide layer 126 is formed by a conventional oxidation or CVD process and has a thickness of between about 50 Å to about 300 Å with a preferred thickness of 100 Å. An etch mask layer of silicon nitride ($Si_3N_4$) 128 is then formed over pad oxide layer 126 by a conventional CVD method and has a thickness of between about 500 Å to about 2000 Å with a preferred thickness of 1000 Å.

Pad oxide layer 126 serves to bind $Si_3N_4$ layer 128 to epitaxial-silicon layer 122 and polysilicon layer portions 124a and 124b and to reduce stress between $Si_3N_4$ layer 128 and underlying silicon layers 122, 124a, 124b. $Si_3N_4$ layer 128 and pad oxide layer 126 are patterned by, for example as shown in FIG. 9, depositing, exposing and developing photoresist layer 130 by photolithography as is well known in the art, followed by etching by a dry or wet etch, for example. $Si_3N_4$ layer 128 and pad oxide layer 126 may also be patterned by other methods, for example direct writing. The outer areas of left and right outer polysilicon layer portions 124a and 124b not protected by $Si_3N_4$ layer 128 are etched away to form left and right outer polysilicon layer portions 124a' and 124b' thereby defining the outer diameter of the subsequently formed transistor.

Figure 10B:
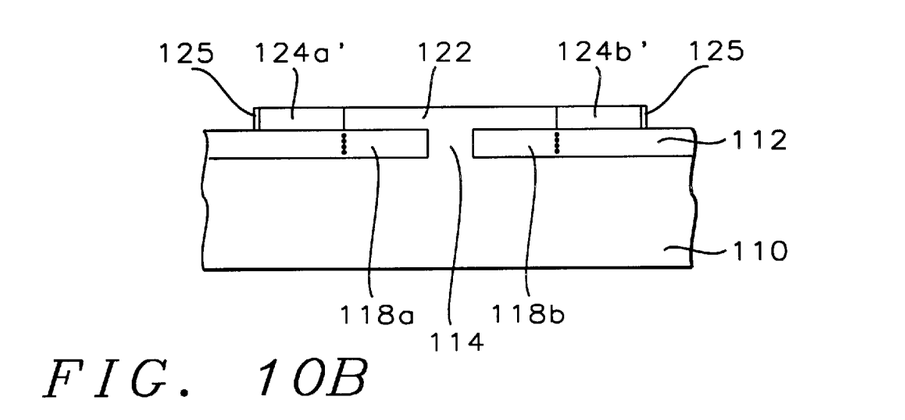

Either the structure shown in FIG. 10A or 10B may then be formed. If the structure shown in 10B is desired, photoresist layer 130, if used, is then removed as is $Si_3N_4$ layer 128 and pad oxide layer 126. Optionally, if an oxide layer has formed on the surface of silicon layers 122, 124a, 124b, it may be removed by any conventional method. To further isolate adjacent transistors, the gap between adjacent 124b', 124a' polysilicon layer portions (See FIGS. 11 and 12) is filled with interlevel dielectric (ILD).

If the structure shown in 10A is desired, the unprotected portions of polysilicon layer portions 124a, 124b are further etched as is a portion of the underlying uppermost silicon layer of semiconductor structure 110 to a depth of from about 1000 to 4000 Å, and more preferably from about 2000 to 3000 Å, to form shallow isolation trenches 132 which are then filled with oxide. Shallow isolation trenches 132 serve to isolate adjacent transistors from each other. Then photoresist layer 130, if used, is then removed as is $Si_3N_4$ layer 128 and pad oxide layer 126. Optionally, if an oxide layer has formed on the surface of silicon layers 122, 124a, 124b, it may be removed by any conventional method.

Although either structure shown in FIGS. 10A and 10B may be used to fabricate the final transistor, for purposes of example, the structure shown in FIG. 10B will be used for the following steps.

Figure 12:
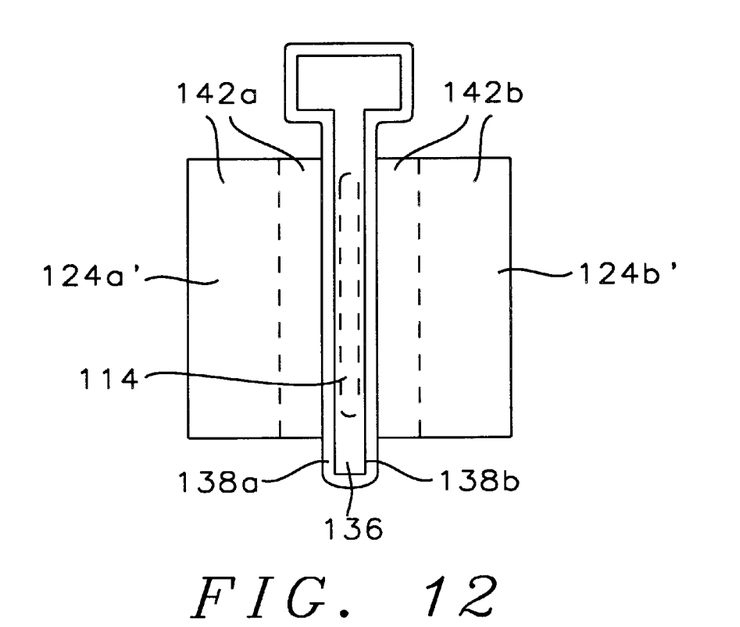
FIG. 12 is a top plan view of FIG. 11.

As shown in FIG. 11 and FIG. 12 (an top plan, or overhead, view of FIG. 11), a thin silicon dioxide layer 134 is thermally grown at a temperature between about 700° to 1000° C., to a thickness between about 115 to 80 Å. Silicon dioxide layer 134 will be used as the gate oxide insulator layer for the subsequent transistor device. A polysilicon film is next deposited using low pressure chemical vapor deposition (LPCVD) processing at a temperature between about 550 to 650° C. to a thickness between about 1200 to 3000 Å. The polysilicon layer can be deposited intrinsically and doped during the following source/drain implant process. The polysilicon film can also be deposited by using insitu doping procedures which include the addition of either phosphine or arsine to the silane ambient. Standard photolithographic and reactive ion etching (RIE) procedures, using $Cl_2$ or HBr as an enchant, are employed to create polysilicon structure 136. Side wall oxide portions 125 of left and right outer polysilicon layer portions 124a' and 124b' are used to remove etching damage.

Insulator side wall spacers 138a, 138b are created for gate 136 by initially depositing silicon oxide, using either LPCVD or plasma enhanced chemical vapor deposition (PECVD), processing at a temperature between about 600° to 800° C., to a thickness between about 800 to 2500 Å. Next, an anisotropic, RIE procedure, using $CHF_3$ as an etchant, is employed to create the spacer 138a, 138b.

An ion implantation step, using arsenic at an energy between about 5 to 40 Kev., at a dose between about 1E14 to 1E16 atoms/cm², is used to create source and drain 142a, 142b (leaving LDD source and drain areas 140a, 140b) within left and right outer polysilicon layer portions 124a', 124b' and epitaxial-silicon layer 122 not protected by gate 136 and side wall spacers 138a, 138b to form the structure shown in FIGS. 11 and 12. This creates a source/drain-on-insulator transistor having the source and drain on a layer of insulation dielectric that provides the advantages of having a smaller source/drain coupling capacitance, lower source/drain leakage to substrate, and a lower sub-threshold leakage since there is no source/drain junction. The only junction is source/drain along the gate edge. It is noted that the devices are not fully isolated.

Although one example of a SDOI transistor has been fabricated for illustrative purposes, the novel method of the present invention may be use to fabricate many other SDOI integrated circuit structures/transistors.

Field effect transistors (FET) and other devices are completed by conventional steps. Wells can be formed in portions of the substrate. Threshold voltage implants ($V_t$ I/I) can be performed. For example, as shown in FIG. 11, an FET is formed. A gate dielectric layer, e.g. gate oxide layer, is formed over the epi (epitaxial silicon) layer 122. A gate electrode 136 is formed thereover. Gate electrode 136 may comprise polysilicon, suicides, and/or metals. LDD (low doped drain) 140a, 140b are formed adjacent to gate electrode 136. Spacers are formed on gate electrode 136. S/D (source/drain) regions 142a, 142b are then formed in the epi and polysilicon.

While particular embodiments of the present invention have been illustrated and described, it is not intended to limit the invention, except as defined by the following claims.

We claim:

1. A method for fabricating a silicon-on-insulator device on a semiconductor substrate, comprising the steps of:

providing said semiconductor substrate having a silicon surface with an overlying insulating dielectric layer;

patterning said insulating dielectric layer to define hole regions having predetermined widths;

forming a silicon layer having a predetermined thickness over said dielectric layer and said hole regions, filling said hole regions; said silicon layer is comprised of amorphous silicon;

heating (grain growth) said silicon layer to form a planar epitaxial-silicon layer, having a predetermined thickness, over said dielectric layer and through said hole regions, filling said hole regions;

patterning said epitaxial-silicon layer to expose said hole regions and define transistor regions separated by said hole regions;

forming trenches in said silicon surface in said hole regions adjacent said epitaxial-silicon layer;

forming shallow trench isolation regions filling said trenches and having a predetermined depth within said hole regions; and forming transistor structures within said transistor regions, separated by said shallow trench isolation regions;

whereby said transistor structures are on said patterned epitaxial-silicon-on-said insulating dielectric layer.

2. The method of claim 1, wherein said predetermined thickness of said planar epitaxial-polysilicon layer is from about 500 to 1500 Å thick.

3. The method of claim 1, wherein said hole regions are from about 500 to 4000 Å wide.

4. The method of claim 1, including the step of forming an interdielectric layer over said transistor structures.

5. The method of claim 1, wherein said shallow isolation trenches are from about 1000 to 4000 Å deep.

6. The method of claim 1, wherein said patterning of said epitaxial-silicon layer includes the following steps:

forming a pad oxide layer over said epitaxial-silicon layer and centered over said patterned dielectric layer;

forming a silicon nitride layer over said pad oxide layer; and patterning said pad oxide layer, silicon nitride layer and a portion of said planar epitaxial-silicon layer to expose said hole regions and define said transistor region.

7. The method of claim 1, wherein said silicon layer is formed by LPCVD at a temperature less than about 600° C. with a gas selected from the group comprising $SH_4$ and $SiH_2Cl_2$, with said heating of said silicon layer is performed in a vacuum at a temperature between about 550 to 650° C.

8. The method of claim 1, wherein said predetermined thickness of said planar epitaxial-silicon layer is from about 500 to 1500 Å, and said hole regions are from about 500 to 4000 Å wide.

9. The method of claim 1, wherein said silicon layer comprises amorphous silicon and said heating of said silicon layer is conducted at a temperature from about 550° to 650° C.

10. The method of claim 1, wherein formation of said shallow trench isolation regions comprises the steps of:

depositing a pad oxide layer over said epitaxial-silicon layer;

depositing a $Si_3N_4$ layer over said pad oxide layer;

patterning said $Si_3N_4$, pad oxide, epitaxial-silicon layer, and insulating dielectric layers and forming said trenches;

depositing oxide in said trenches;

planarizing said oxide filled trenches exposing said $Si_3N_4$ layer; then removing said $Si_3N_4$ and pad oxide layers by a wet chemical treatment.

11. The method of claim 1, wherein said transistor structures include:

a gate on said transistor region; and source and drain regions on either side of said gate also formed on said transistor region.

12. The method of claim 1, wherein said silicon layer is formed by LPCVD at a temperature less than about 600° C. with a gas selected from the group comprising $SH_4$ and $SiH2Cl_2$, with said heating of said silicon layer is performed in an inert gas atmosphere at a temperature between about 550 to 650° C.

13. A method for fabricating a silicon-on-insulator device on a semiconductor substrate, comprising the steps of:

providing said semiconductor substrate having a silicon surface with an overlying insulating dielectric layer;

patterning said insulating dielectric layer to define hole regions having predetermined widths;

forming a silicon layer, having a predetermined thickness of from about 500 to 1500 Å, over said dielectric layer and said hole regions;

heating (grain growth) said silicon layer to form a planar epitaxial-silicon layer, having a predetermined thickness, over said dielectric layer and within said hole regions, filling said hole regions;

patterning said epitaxial-silicon layer to expose said hole regions and define transistor regions separated by said hole regions;

forming shallow trench isolation regions having predetermined depths within said hole regions; and forming transistor structures within said transistor regions, separated by said shallow trench isolation regions, said transistor structures including:

a gate on said transistor region; and source and drain regions on either side of said gate also formed on said transistor region;

whereby said transistor structures are on said patterned epitaxial-silicon-on-said insulating dielectric layer.

14. The method of claim 13, including the step of forming an interdielectric layer over said transistor structures.

15. The method of claim 13, wherein said predetermined thickness of said planar epitaxial-silicon layer is from about 500 to 1500 Å, and said hole regions are from about 500 to 4000 Å wide.

16. The method of claim 13, wherein said patterning of said epitaxial-silicon layer includes the following steps:

forming a pad oxide layer over said epitaxial-silicon layer and centered over said patterned dielectric layer;

forming a $Si_3N_4$ layer over said pad oxide layer; and patterning said pad oxide layer, $Si_3N_4$ layer and a portion of said planar epitaxial-silicon layer to expose said hole regions and define said transistor region.

17. The method of claim 13, wherein said predetermined thickness of said planar epitaxial-polysilicon layer is from about 500 to 1500 Å thick.

18. The method of claim 13, wherein said silicon layer comprises amorphous silicon and said heating of said silicon layer is conducted at a temperature of from about 550° to 650° C.

19. A method for fabricating a source/drain-on-insulator device on a semiconductor substrate, comprising the steps of:

providing said semiconductor substrate having a silicon surface with an overlying insulating dielectric layer;

patterning said insulating dielectric layer to define a channel region, said dielectric layer being divided into left inner and outer portions and right inner and outer portions;

forming an amorphous silicon layer, having a predetermined thickness, over said dielectric layer and said channel region;

heating (grain growth) said amorphous silicon layer to form planar polysilicon layers, having predetermined widths and thicknesses, over said left and right outer insulating dielectric layer portions and to form a planar epitaxial-silicon layer, having a predetermined width and thickness, over said left and right inner insulating dielectric layer portions and within said channel region, filling said channel region;

patterning said polysilicon and epitaxial-silicon layers to define a transistor region; and forming a transistor structure within said transistor region, said transistor structure having:

a gate centered on said channel region; and source and drain regions on either side of said gate formed within said planar polysilicon layer and part of said planar epitaxial-silicon layer outward of said channel region; whereby said source and drain regions are on said patterned insulating dielectric layer.

20. The method of claim 19, wherein said planar polysilicon and planar epitaxial-silicon layer are from about 500 to 1500 Å thick.

21. The method of claim 19, wherein said channel region is from about 500 to 4000 Å wide.

22. The method of claim 19, including the step of forming an interdielectric layer over said transistor structure.

23. The method of claim 19, including the step of forming shallow isolation trenches on each side of said transistor structure.

24. The method of claim 19, wherein said patterning of said polysilicon and epitaxial-silicon layers includes the following steps:

forming a pad oxide layer over said polysilicon and epitaxial-silicon layers centered over said channel region;

forming a $Si_3N_4$ layer over said pad oxide layer; and patterning said pad oxide layer, $Si_3N_4$ layer and a portion of said planar polysilicon layer to define said transistor region.

25. The method of claim 19, wherein said silicon layer comprises amorphous silicon and said heating of said silicon layer is conducted at a temperature of from about 550° to 650° C.

26. A method for fabricating a source/drain-on-insulator device on a semiconductor substrate, comprising the steps of:

providing said semiconductor substrate having a silicon surface with an overlying insulating dielectric layer;

patterning said insulating dielectric layer to define a channel region having a width from about 500 to 4000 Å, said dielectric layer being divided into left inner and outer portions and right inner and outer portions;

forming a silicon layer, having a predetermined thickness of from about 500 to 1500 Å, over said dielectric layer and said channel region;

heating (grain growth) said silicon layer to form planar polysilicon layers, having predetermined widths and thicknesses, over said left and right outer insulating dielectric layer portions and to form a planar epitaxial-silicon layer, having a predetermined width and thickness, over said left and right inner insulating dielectric layer portions and within said channel region, filling said channel region;

patterning said polysilicon and epitaxial-silicon layers to define a transistor region; and forming a transistor structure within said transistor region, said transistor structure having:
- a gate centered on said channel region; and
- source and drain regions on either side of said gate formed within said planar polysilicon layer and part of said planar epitaxial layer outward of said channel region;

whereby said source and drain regions are on said patterned insulating dielectric layer.

27. The method of claim 26, including the step of forming an interdielectric layer over said transistor structure.

28. The method of claim 26, including the step of forming shallow isolation trenches on each side of said transistor structure.

29. The method of claim 26, wherein said patterning of said polysilicon and epitaxial-silicon layers includes the following steps:
- forming a pad oxide layer over said polysilicon and epitaxial-silicon layers centered over said channel region;
- forming a $Si_3N_4$ layer over said pad oxide layer; and
- patterning said pad oxide layer, $Si_3N_4$ layer and a portion of said planar olysilicon layer to define said transistor region.

30. The method of claim 26, wherein said silicon layer comprises amorphous silicon and said heating of said silicon layer is conducted at a temperature of from about 550° to 650° C.

31. A method for fabricating a transistor device on a semiconductor substrate, comprising the steps of:

providing said semiconductor substrate having a silicon surface with an overlying insulating dielectric layer;

patterning said insulating dielectric layer to define hole/channel regions having predetermined widths;

forming an amorphous silicon layer having a predetermined thickness over said dielectric layer and said hole/channel regions, filling said hole/channel regions;

heating (grain growth) said amorphous silicon layer to form a planar silicon layer, comprising at least a portion of epitaxial-silicon, having a predetermined thickness, over said dielectric layer and through said hole/channel regions, filling said hole/channel regions;

patterning said planar silicon layer to expose said hole/channel regions and define transistor regions;

forming trenches in said silicon surface adjacent said transistor regions;

forming shallow trench isolation regions filling said trenches and having a predetermined depth; and forming transistor structures within said transistor regions, separated by said shallow trench isolation regions.

* * * * *